United States Patent
Huang et al.

(10) Patent No.: US 6,392,285 B1
(45) Date of Patent: May 21, 2002

(54) METHOD FOR FABRICATING A CAPACITOR DEVICE WITH BICMOS PROCESS AND THE CAPACITOR DEVICE FORMED THEREBY

(75) Inventors: Chih-Mu Huang; Chuan-Jane Chao, both of Hsinchu; Chi-Hung Kao, Taipei, all of (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/461,014

(22) Filed: Dec. 14, 1999

(30) Foreign Application Priority Data

Oct. 4, 1999 (TW) .......................... 88117048 A

(51) Int. Cl.[7] ........................................... H01L 27/082
(52) U.S. Cl. ...................... 257/577; 438/328; 438/329; 438/330
(58) Field of Search ................... 257/577; 438/328, 438/329, 330

(56) References Cited

U.S. PATENT DOCUMENTS

| 5,620,908 A | * | 4/1997 | Inoh et al. ................... 438/207 |
| 5,736,760 A | * | 4/1998 | Hieda et al. ................. 257/301 |
| 5,899,714 A | * | 5/1999 | Farrenkopf et al. .......... 438/202 |
| 6,156,594 A | * | 12/2000 | Gris ............................ 438/202 |

FOREIGN PATENT DOCUMENTS

EP  843355 A1 * 5/1998 ........ H01L/21/8249

* cited by examiner

Primary Examiner—Nathan Flynn
Assistant Examiner—Scott R. Wilson
(74) Attorney, Agent, or Firm—Fish & Richardson, P.C.

(57) ABSTRACT

The present invention discloses a simple and convenient method for fabricating a capacitor device with BiCMOS processes. An electrode of the capacitor device formed according to the present invention is an ion doping region formed in an epitaxy layer so that the thickness of the dielectric layer of the capacitor device decreased relative to a specific ion concentration. Accordingly, the capacitor device formed therein has a high capacitance and good performance.

6 Claims, 11 Drawing Sheets

US 6,392,285 B1

METHOD FOR FABRICATING A CAPACITOR DEVICE WITH BICMOS PROCESS AND THE CAPACITOR DEVICE FORMED THEREBY

BACKGROUND OF THE INVENTION

1. Field of the Invention

The present invention relates to a semiconductor integrated circuit, and more particularly to a method for fabricating a capacitor device with BiCMOS processes and the capacitor device formed thereby.

2. Description of the Prior Art

Recently, capacitor devices have become principal components of many semiconductor integrated circuits. For example, a stacked capacitor is used in a dynamic random access memory (DRAM), or a capacitor having two electrodes and a dielectric layer is applied in a mix-logic/analog circuit.

Referring to FIG.1, a conventional capacitor used in a mix-logic/analog circuit is schematically depicted in a cross-sectional view. The circuit, including a BiCMOS device, is formed upon a silicon substrate 10 of a P-type conductivity, in which a plurality of field oxides FOX are formed to isolate a plurality of active regions of the device. A CMOS region 11 composed of an NMOS transistor 110 and a PMOS transistor 111 on a P-well and an N-well having a gate G1, a source S1, a drain D1, and a gate G2, a source S2, a drain D2, respectively, is formed by traditional processes. An NPN bipolar transistor 12 formed adjacent to the CMOS region 11 includes a collector 120, a base 121, a base contact 123, an emitter 122, and an emitter contact 124. Adjacent to the bipolar transistor 12 is a poly to poly electrodes capacitor 13 composed of a bottom electrode (a polysilicon layer) 131, a polysilicon layer 132 for decreasing the resistance of the junction, a dielectric layer (a silicon dioxide layer) 133, and an upper electrode (a polysislicon layer) 134. Further, in order to increase the conductivity of the bottom electrode 131, an ion implantation or in-situ doped implantation is used to implant Arsenic ions or Phosphorous ions into the polysilicon layer 131. An N-type conductivity layer is therefore formed.

As described above, a capacitor basically has two electrodes (conducting plates) spaced by an insulator (a silicon dioxide layer). As well known by those persons skilled in this field, the most important parameters effecting the charges stored in the capacitor are the dielectric constant, thickness of the insulator, and the area of the capacitor plates. However, the capacitor with this structure described above suffers from depletion. In order to prevent the occurrence of the depletion issue, the bottom electrode is therefore doped with a high concentration ions. This will increase the thickness of the silicon dioxide layer (insulator) formed by oxidation of a thermal cycle thereafter. According to the calculation of the capacitance C, wherein C equals to the voltage drop of the capacitor divided by the thickness of the capacitor ($C=\epsilon/d$), the capacitance is reduced due to the increment of the thickness of the insulator. Further, the performance of the device is effected.

In addition, the process include two steps of forming polysilicon layers. The time and the cost for fabricating the two layers is therefore increased.

SUMMARY OF THE INVENTION

Accordingly, an object of the present invention is to provide a simple and inexpensive method for fabricating a capacitor device with BiCMOS processes wherein the dielectric layer of the capacitor formed therein is thin.

The other object of the present invention is to provide a capacitor device formed in an epitaxy layer in which a doping region is formed to be an electrode of the capacitor. Therefore, neither time nor the cost is increased. Moreover, the capacitor formed therein has high capacitance and good performance.

To attain the first object of the present invention, a method for fabricating a capacitor device with BiCMOS processes on a semiconductor substrate is provided. The method comprises the following steps. First, a first buried layer and a second buried layer are formed in the semiconductor substrate. Subsequently, an epitaxy layer is formed above the semiconductor substrate, then three wells and a collector region are formed in the epitaxy layer, wherein two of the three wells form a CMOS transistor region, and the other well is a bottom electrode of the capacitor device. Additionally, the collector region and the bottom electrode are in contact with the two buried layers, respectively. After forming an oxide layer over the three wells to be a gate oxide layer of the CMOS transistor and the dielectric layer of the capacitor device, a base region adjacent to the collector region is formed. Afterward, a polysilicon layer is formed on the three wells and the base region to form gate electrodes of the CMOS transistor, an upper electrode of the capacitor device, and a base contact of the base region. Subsequently, source/drain regions and a base region are formed adjacent to the region below the gates of the CMOS transistor and adjacent to the region below the base contact, respectively. In addition, an emitter region is formed in the base region.

It is noted that the dielectric layer is formed on the epitaxy layer by oxidation, directly. Therefore, the thickness of the dielectric layer is thinner than in the conventional art by means of adjusting the ion concentration of the well region (bottom electrode). According to the formula: $C=\epsilon/d$ mentioned before, decreased "d" leads to increased "C". That is: the capacitance of the capacitor according to the present invention is higher than that of the prior art. In addition, the capacitor device is formed with BiCMOS processes, additional steps are not added in the processes. Neither the cost nor the time is increased.

Furthermore, the device described above may contact other devices by the following steps. First, an insulating layer, for example, a boro-phospho-silicate-glass (BPSG) layer is formed above the epitaxy layer, then a plurality of openings are formed in the insulating layer to expose the polysilicon layer, source and drain regions, the collector region, and the base contact. Subsequently, a plurality of plugs are formed in the openings to contact with other devices.

To attain the second object of the present invention, a capacitor device formed with BiCMOS processes on a semiconductor substrate is provided, comprising: a buried layer formed in the semiconductor; an epitaxy layer formed over the semiconductor; a bipolar junction transistor formed in the epitaxy layer having a collector region; a CMOS transistor having a gate oxide and a gate electrode; a well region formed with the collector region in the epitaxy layer and contacting with the buried layer, said well region being a bottom electrode of the capacitor device; an oxide layer formed with the gate oxide on the epitaxy layer over the well, said oxide layer being a dielectric layer of the capacitor device; and a conducting layer formed with the gate electrode on the oxide layer, said conducting layer being an upper electrode of the capacitor device.

BRIEF DESCRIPTION OF THE DRAWINGS

The present invention will become more fully understood from the detailed description given hereinbelow and the accompanying drawings, given by way of illustration only and thus not intended to be limitative of the present invention.

FIGS. 2A through 2K schematically depict in cross-sectional views steps involved in a method for fabricating a capacitor device with BiCMOS processes according to an embodiment of the present invention.

DETAILED DESCRIPTION OF THE INVENTION

Figure 1:
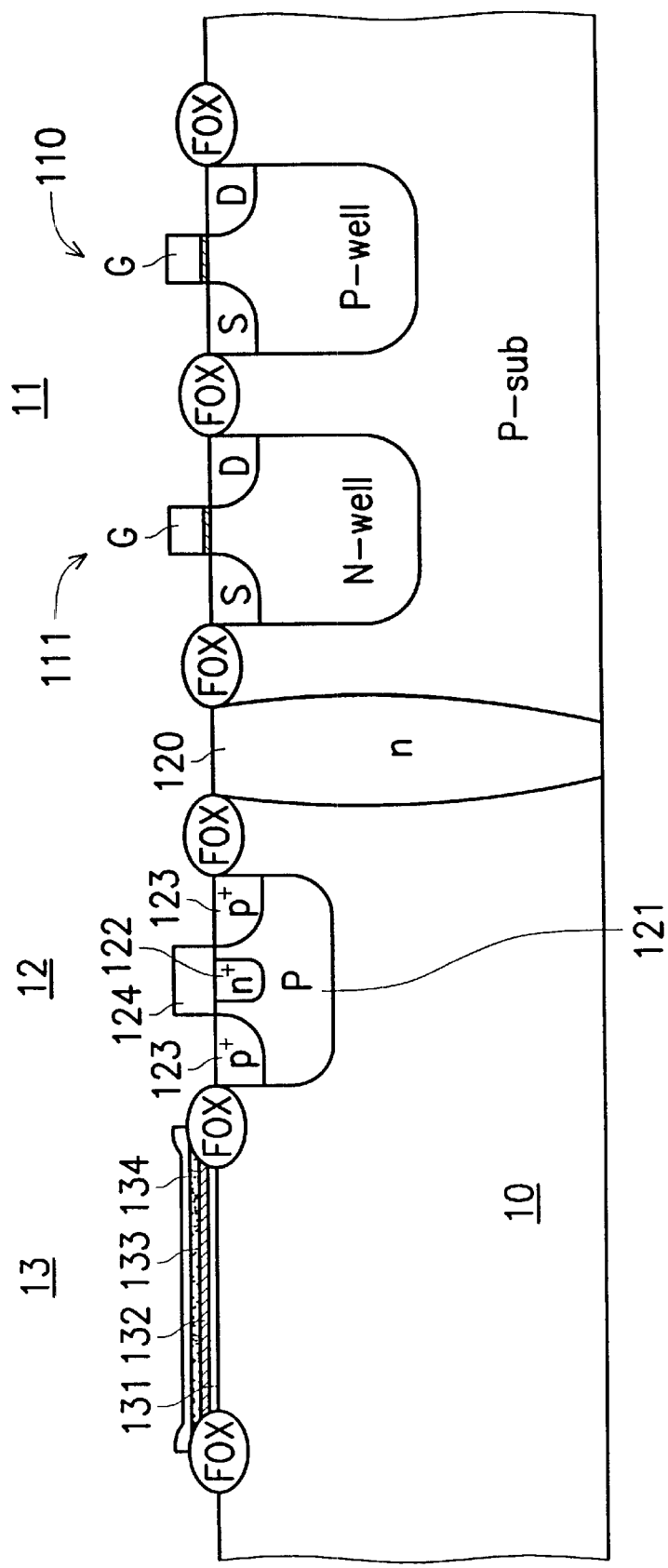
FIG. 1 schematically depicts a conventional capacitor having two electrodes (conducting plates) spaced by an insulator and a BiCMOS device fabricated onto a semiconductor substrate in a cross-sectional view.
Figure 2A:
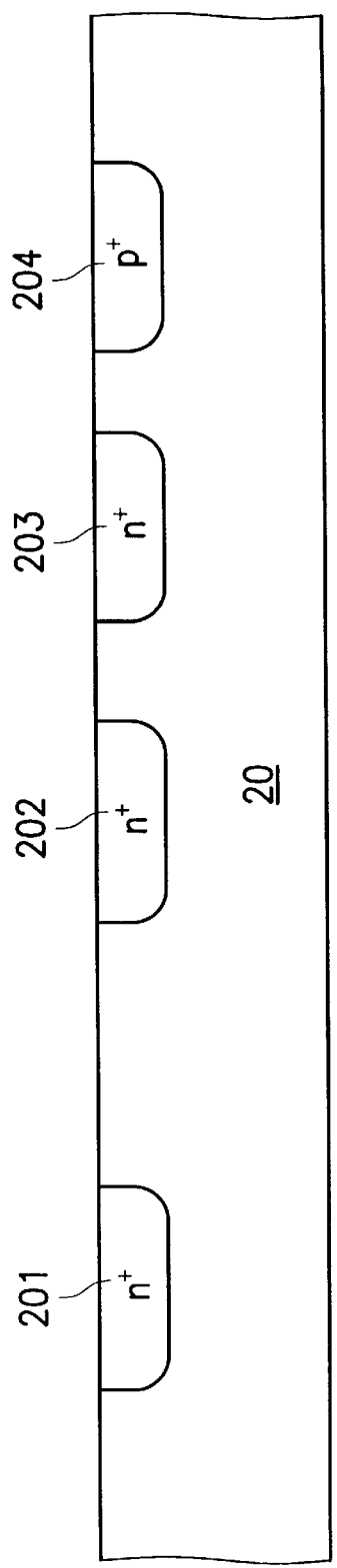

Referring to FIG. 2A, a semiconductor substrate such as a silicon substrate 20 is provided, then a first buried layer and a second buried layer are formed in the semiconductor substrate. For example, Arsenic ions and Boron ions with implantation energy of 50 Kev, and a flow density of 1E 15 atoms/cm$^2$ are implanted into the silicon substrate 20. Therefore, an N-type buried layer 201, an N-type buried layer 202, an N-type buried layer 203, and a P-type buried layer 204 are formed.

Figure 2B:
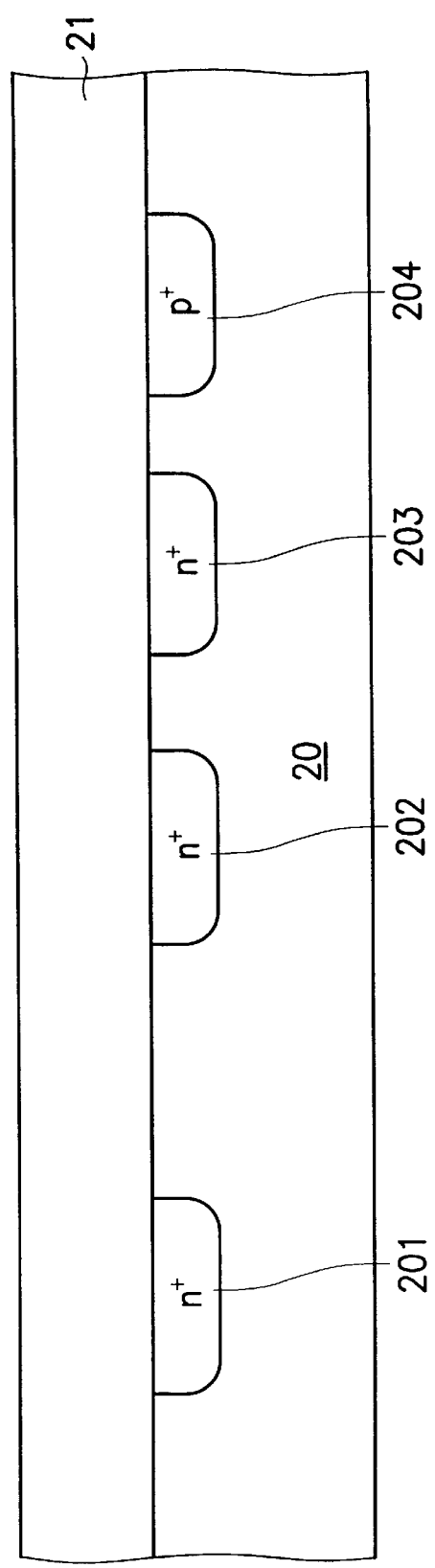

Subsequently, an epitaxy layer is formed upon the semiconductor. Referring to FIG. 2B, an epitaxy layer, for example, an N-type epitaxy layer 21 with a concentration of $10^{14}$~$10^{15}$ is formed on the silicon substrate 20.

Figure 2C:
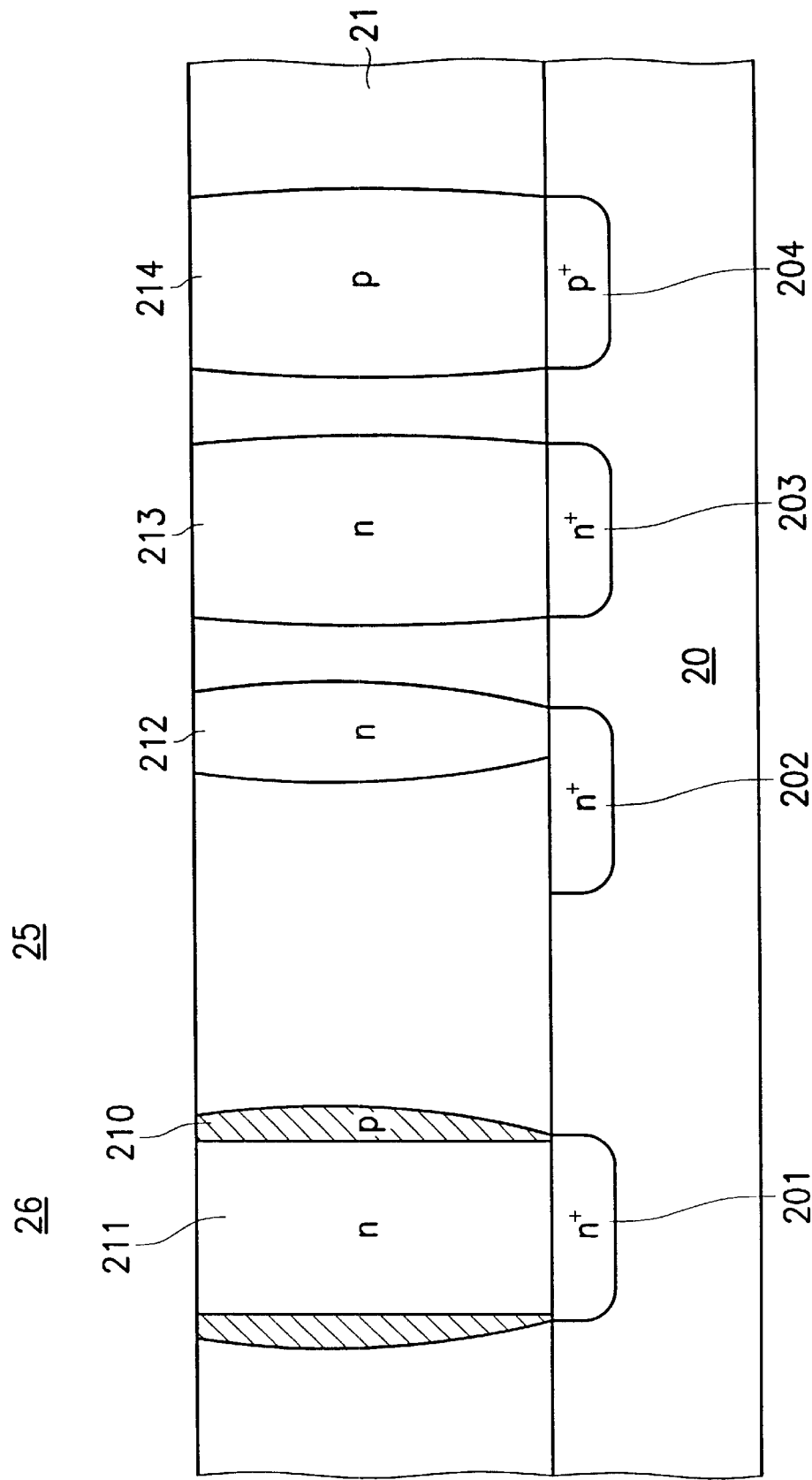

The following step of the invention is forming a first well, a collector region, a second well, and a third well in the epitaxy layer, wherein the second well and the third well are doped with ions of a first type and a second type conductivity, respectively, and said first well and said collector region contact said first buried layer and said second buried layer, respectively. Referring to FIG. 2C, P-type ions, for example, Boron ions, are doped into the epitaxy layer 21 above the buried layer 201 and 204 to form P-type wells 210 and 214. Thereafter, N-type ions, for example, Arsenic ions, are doped into the epitaxy layer 21 above the buried layer 202 and 203 to form N-type wells 212 and 213, wherein the N-type well 212 is a collector region 212 of a bipolar junction transistor device 25 (not formed). Subsequently, N-type ions, for example, Arsenic ions with a higher concentration than that of the P-type well 210 are doped into the P-type well 210 so that the P-type well 210 converts to an N-type well 211 with a concentration of $10^{15}$~$10^{16}$ atoms/cm$^3$ to be a bottom electrode of a capacitor device 26 (not formed).

Figure 2D:
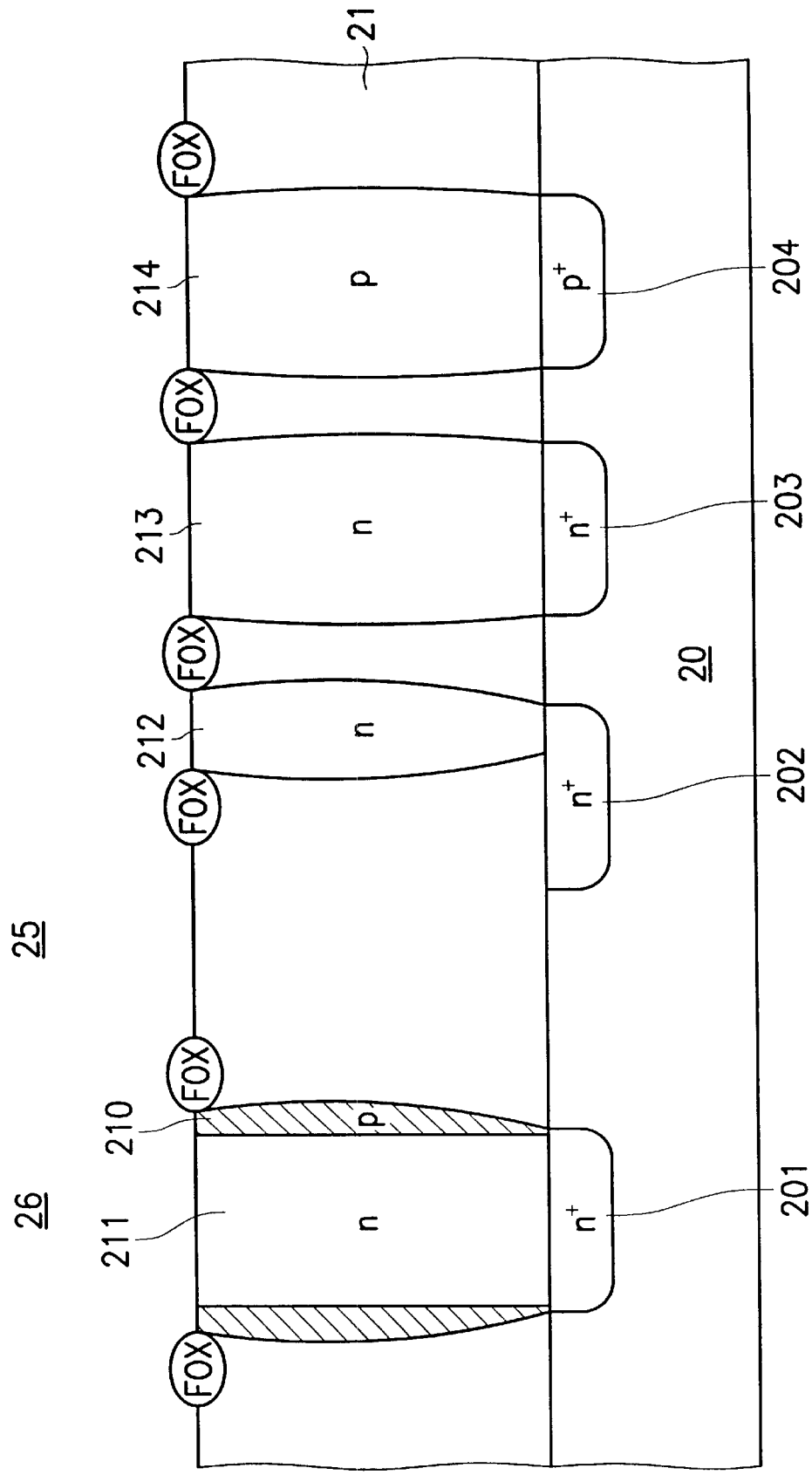
Figure 2E:
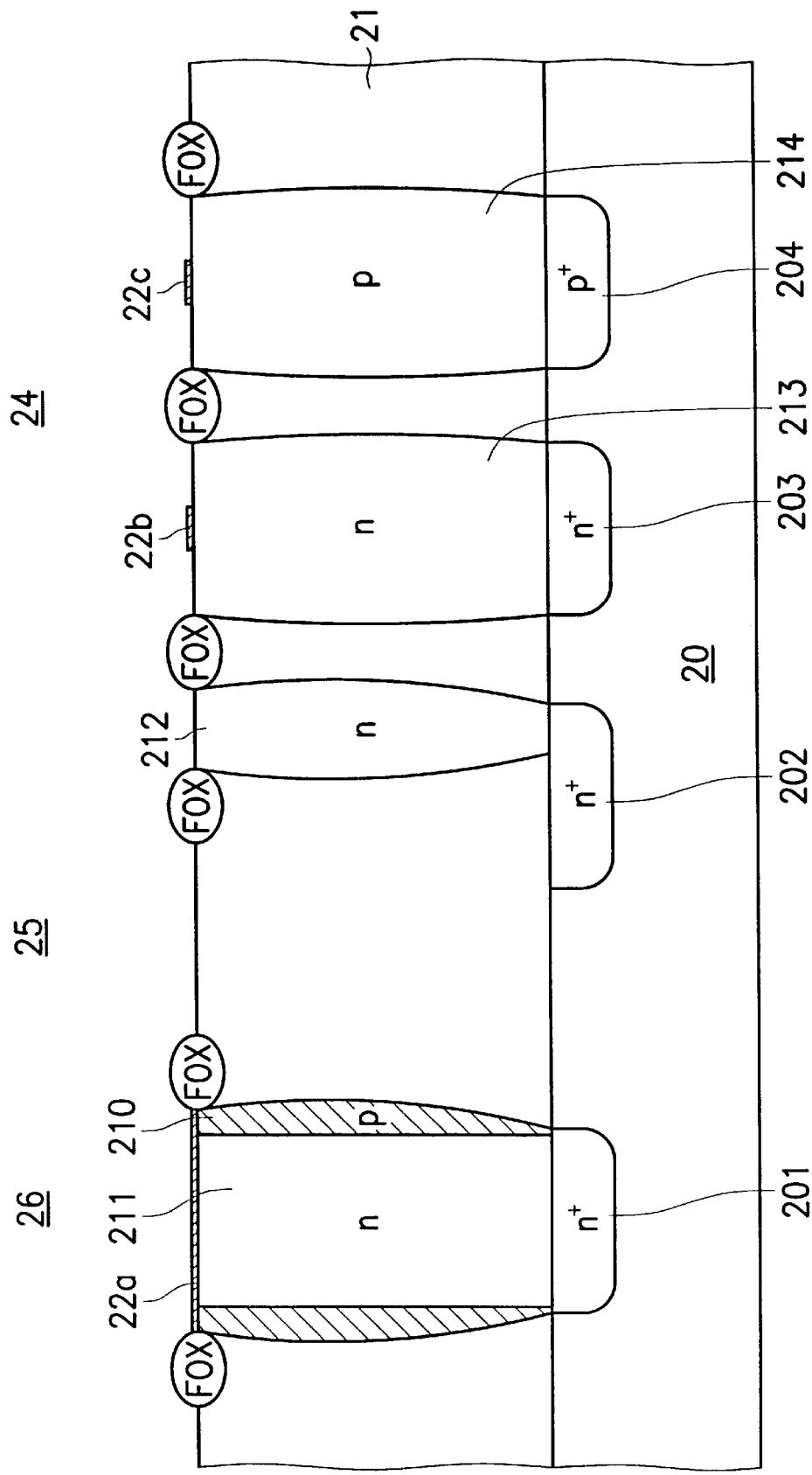

Please refer to FIG. 2D. By local oxidation (LOCOS), a plurality of field oxides FOX are formed on the epitaxy layer 21 to define active regions therebetween. A patterned oxide layer is then formed over the epitaxy layer. As shown in FIG. 2E, a silicon dioxide layer (not shown) is formed on the epitaxy layer 21 by thermal oxidation. The silicon dioxide layer (not shown) is patterned by photolithography and etching processes on the epitaxy layer 21 above the well 211 (bottom electrode) to form a dielectric layer 22a of the capacitor device 26 (not formed). Also, the patterned silicon dioxide layer formed on the epitaxy layer 21 above the well 213 and the well 214 are gate oxide layers 22b and 22c of a CMOS device 24 (not formed), respectively. Note that the thickness of the dielectric layer 22a is 100~150 Å.

Figure 2F:
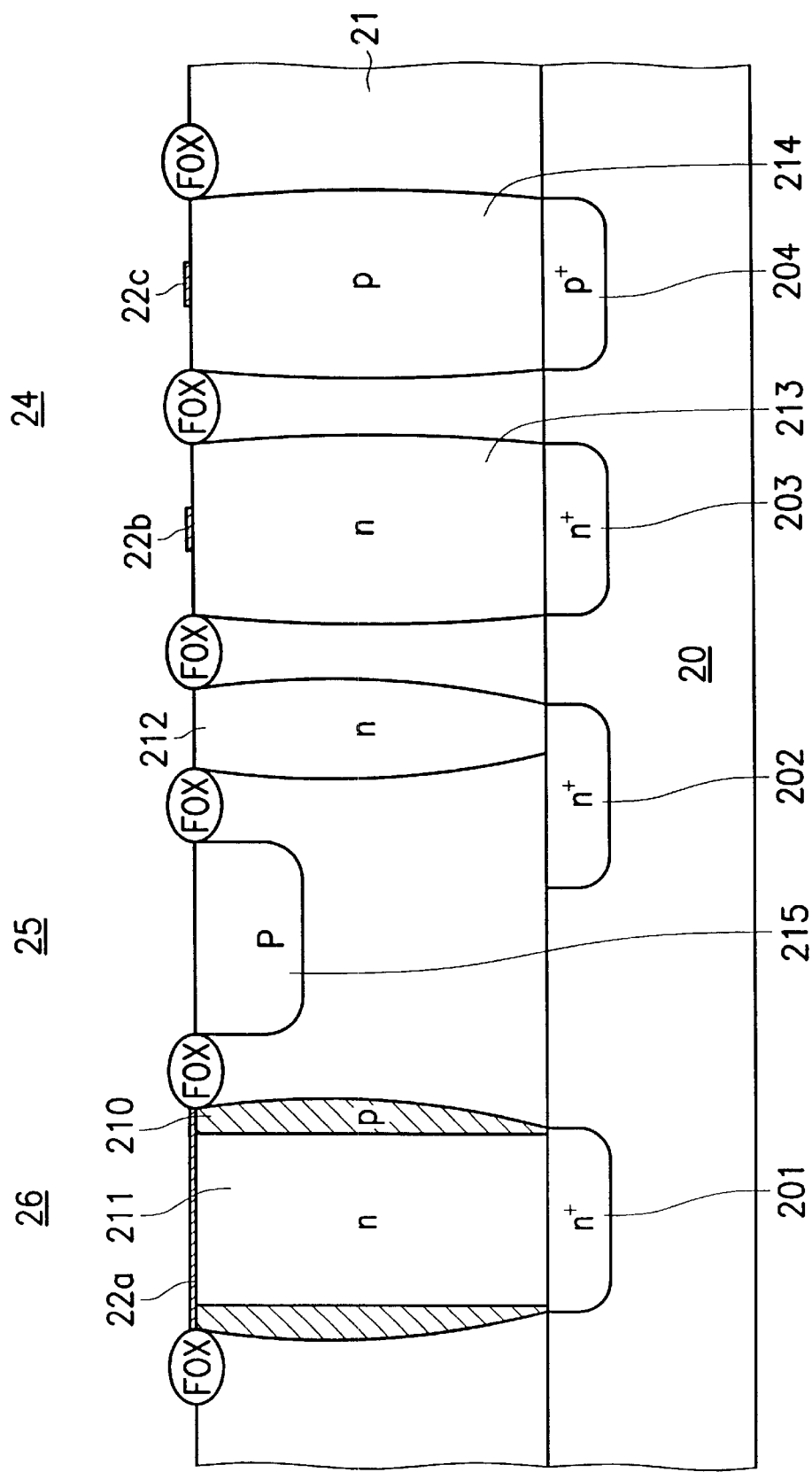

Referring to FIG. 2F, a P-type base region 215 is formed adjacent to the collector region 212 by doping with P-type ions, for example, Boron ions, into the epitaxy layer 21 within an active region.

Figure 2G:
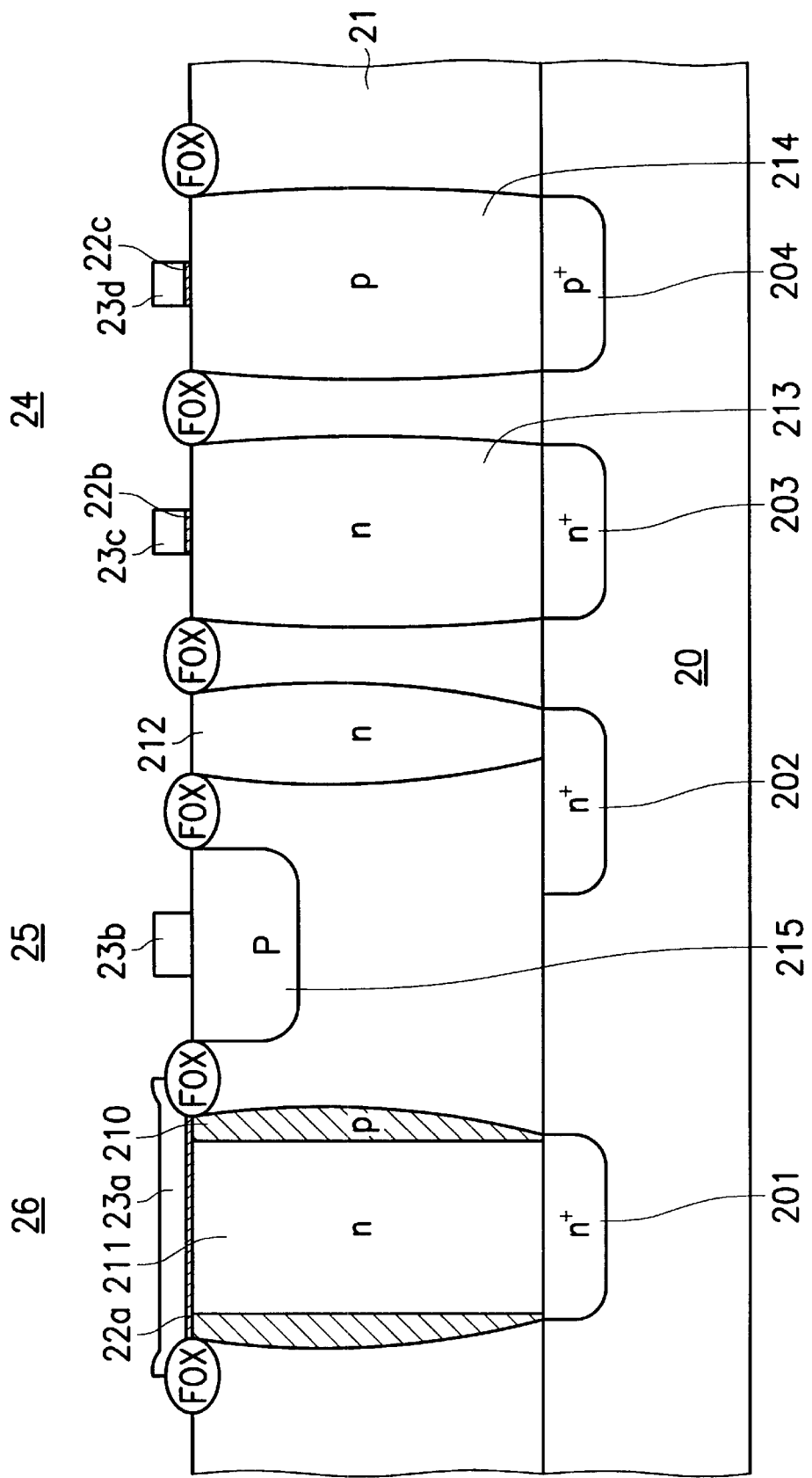

Referring to FIG. 2G, a conducting layer 23a, 23b, 23c, and 23d is formed and patterned over the patterned oxide layer 22a, 22b, 22c and the base region 215. The conducting layer might be made of a polysilicon layer deposited by chemical vapor deposition (CVD) to cover the epitaxy layer 21 globally. By photolithography and etching processes, the polysilicon layers 23a, 23b, 23c, and 23d are formed on the dielectric layer 22a, the epitaxy layer 21 above the base region 215, the gate oxide 22b, and the gate oxide 22c to form an upper electrode of the capacitor device 26, an emitter contact of the bipolar junction transistor 25 (not formed), a gate electrode 23c and a gate electrode 23d of the CMOS transistor device 24 (not formed), respectively.

Figure 2H:
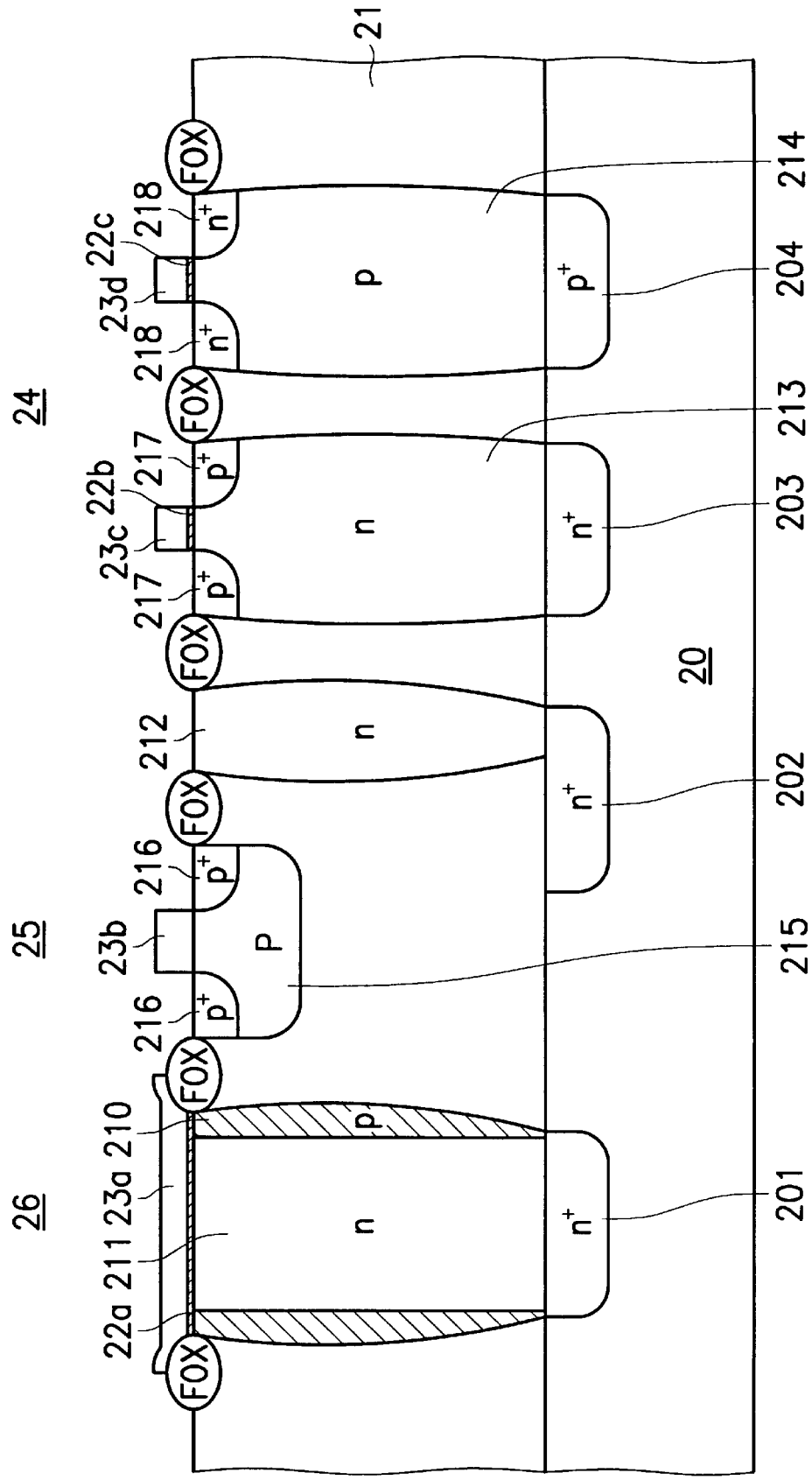
Figure 21:
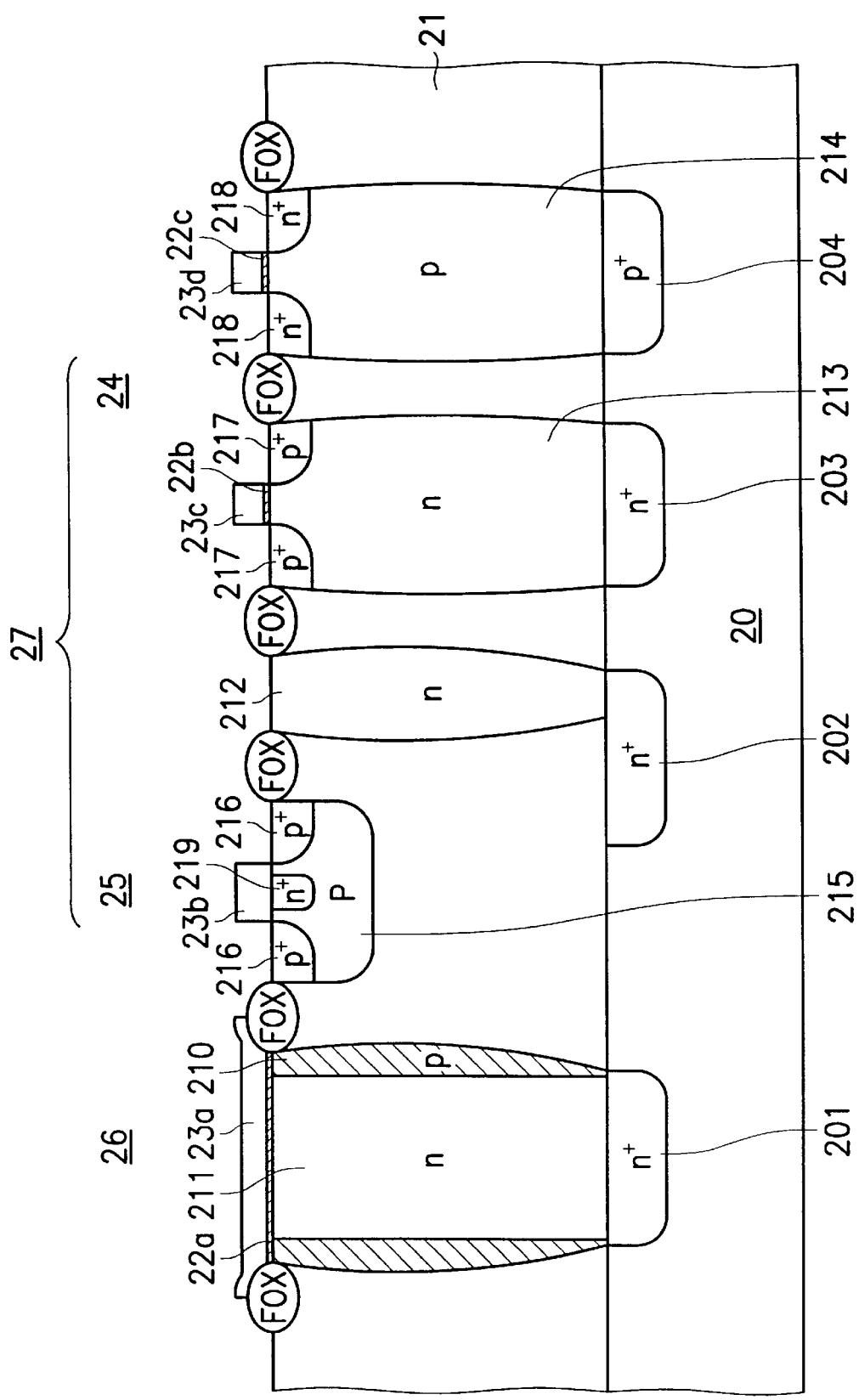

Referring to FIG. 2H, a base contact region 216, and source/drain regions 217, 218 are formed in the base region 215, the well 213, and the well 214. For example, the base contact region 216 and the source/drain regions 217 are formed by means of implanting Boron ions into the base region 215 adjacent to the region below the emitter contact region 23b and into the well 213 adjacent to the region below the gate 23c. Additionally, the source/drain regions 218 are formed by means of implanting Arsenic ions into the well 214 adjacent to the region below the gate 23d. Subsequently, by in-situ doped implantation, ions are implanting into the upper electrode 23a of the capacitor device 26, the emitter contact 23b of the bipolar junction transistor device 25 (not formed), and the gate electrodes 23c, 23d of the CMOS transistor device 24 so that the polysilicon layer 23a, 23b, 23c, and 23d is conductive. Further, the in-situ doped implantation can protect the dielectric layer 22a from damage.

Figure 2J:
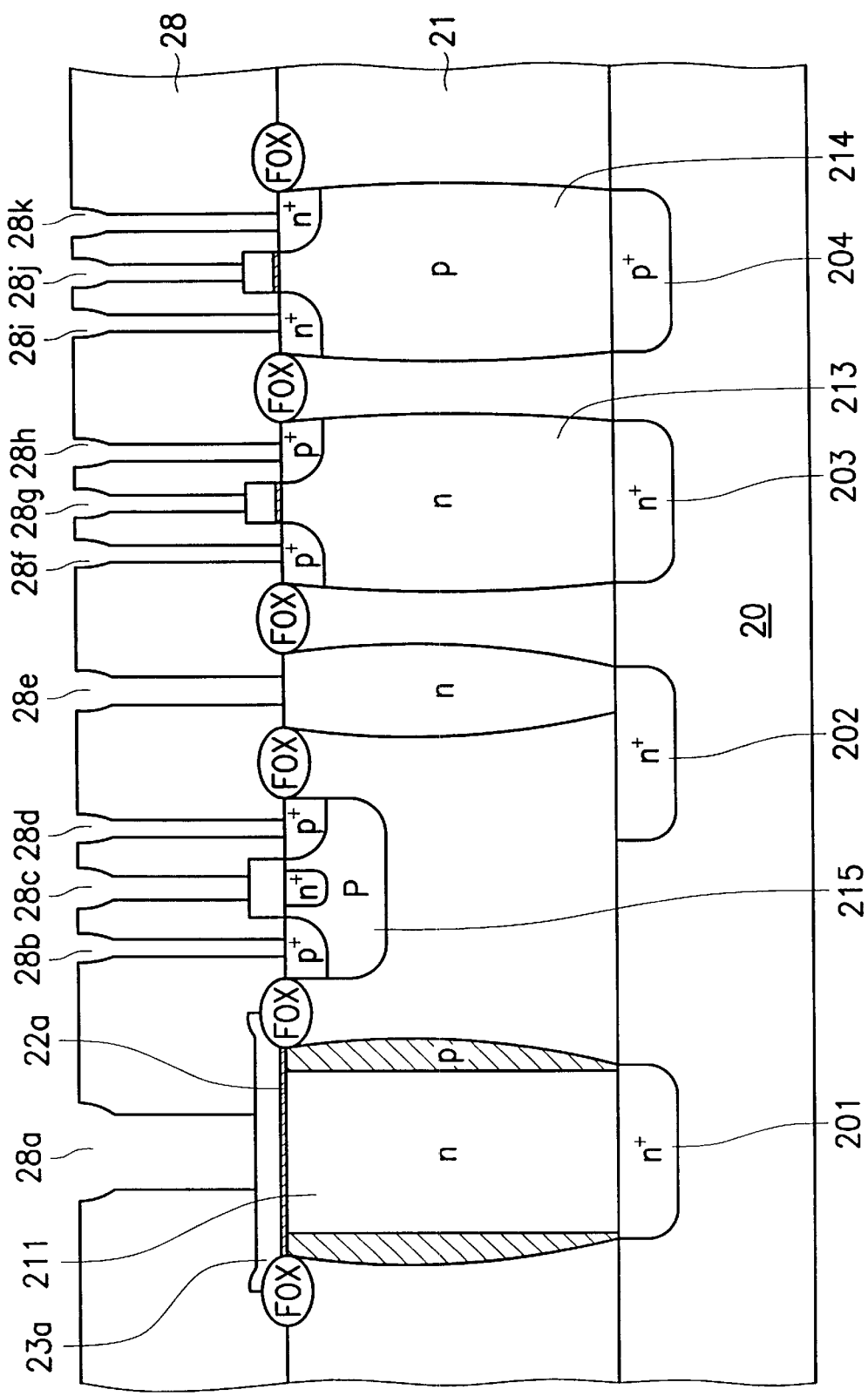

Please refer to FIG. 2I. An emitter region 219 is formed in the base region 215, and the BiCMOS device 27 including the bipolar junction capacitor device 25 is therefore completed. It is noted that the BiCMOS device 27 and the capacitor device 26 might contact with other devices. Therefore, steps of isolation and contact are necessary. As shown in FIG. 2J, a planar BPSG layer 28 is formed by means of flowing the BPSG upon the epitaxy layer 21. By the photolithography and etching processes, openings 28a, 28b, 28c, 28d, 28e, 28f, 28g, 28h, 28i, 28j, 28k are formed so that the electrodes and the ion doping regions are exposed.

Figure 2K:
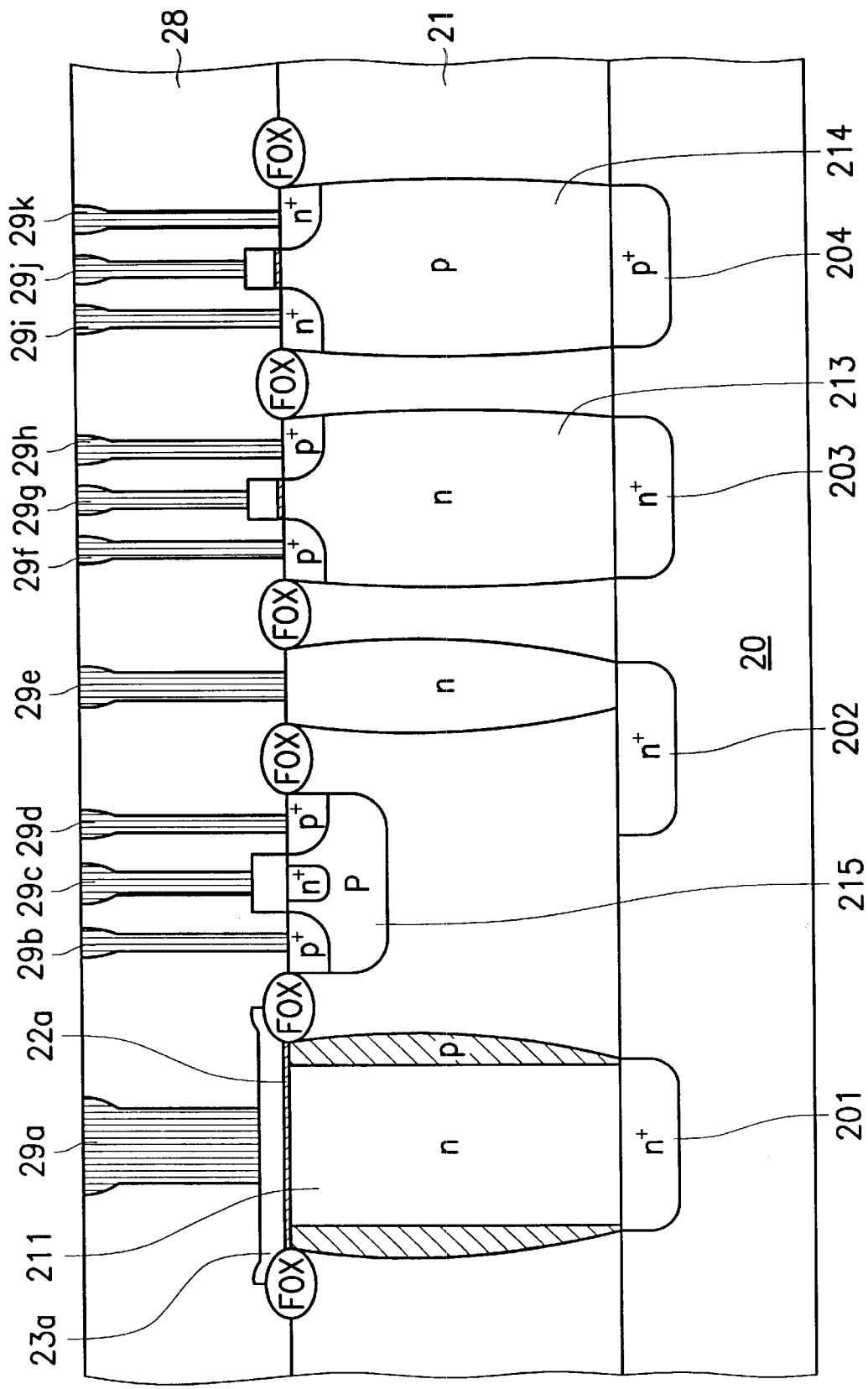

Please refer to FIG. 2K. A conducting layer is formed over the BPSG layer 28 (not shown) and filled in the openings 28a~28k. Preferably, the conducting layer is a polysilicon layer deposited by low-pressure chemical vapor deposition (LPCVD) so as to conformably overlie the entire surface of the BPSG layer 28 and fill in the openings 28a~28k. Subsequently, the polysilicon layer is etched back to form plugs 29a, 29b, 29c, 29d, 29e, 29f, 29g, 29h, 29i, 29j, 29k so that the device according to the present invention contacts with other devices.

Referring back to FIG. 2I, the capacitor device 26 fabricated with a BiCMOS device 27 on a silicon substrate 20 is schematically depicted in a cross-sectional view. As shown in FIG. 2I, N-type buried layers 201, 202, 203 and a P-type buried layer 204 are formed in the silicon substrate 20. An epitaxy layer 21 is formed over the silicon substrate 20, in which an N-well 211 is formed and contacts with the N-type buried layer 201 to be a bottom electrode of the capacitor 26. Further, a dielectric layer 22a made of silicon dioxide is formed over the epitaxy layer 21. In addition, an upper electrode 23a made of polysilicon is formed over the dielectric layer 22a.

As depicted in FIG. 2I, a BiCMOS transistor device 27 formed adjacent to the capacitor device 26 comprises a bipolar junction transistor 25 and a CMOS transistor 24. The bipolar junction transistor 25 includes a collector region 212 in contact with the buried layer 202, a base region 215 adjacent to the collector region 212, a base contact 216 doped with ions in the base region 212, an emitter region 219 formed in the base region, and an emitter contact electrode 23b formed on the epitaxy layer 21 above the emitter region 219.

Additionally, the CMOS transistor 24 formed in the epitaxy layer 21 includes a PMOS transistor and an NMOS transistor arranged in an N-type well 213 and a P-type well 214 respectively, wherein the N-type well 213 contacts the buried layer 203, and the P-type well 214 contacts the buried layer 204. A gate oxide 22b and a gate oxide 22c are formed on the epitaxy layer 21 above the N-type well 213 and the P-type well 214, respectively. A gate electrode 23c and a gate electrode 23d are formed on the gate oxide 22b and the gate oxide 22c, respectively. Further, source/drain regions 217 ($P^+$ doped regions) and source/drain regions 218 ($N^+$ doped regions) are formed in the epitaxy layer 21 adjacent to the regions below the gate electrode 23c and the gate electrode 23d, respectively.

As depicted in FIG. 2K, the device mentioned above may contact other devices by the plugs 29a, 29b, 29c, 29d, 29e, 29f, 29g, 29h, 29i, 29j, and 29k formed in an insulating layer 28 made of BPSG over the epitaxy layer 21. Further, in order to prevent the bottom electrode 211 from short-circuiting the upper electrode 23a when contacting, the contact of the bottom electrode 211 is arranged perpendicular to the cross section illustrated in the figure. Therefore, the plug contacting the bottom electrode 211 is not shown in FIG. 2K.

It is noted that the capacitor device according to the present invention has a polysilicon layer. Therefore, the cost is lower than that of the prior art, which require two polysilicon layers. Additionally, the dielectric layer of the capacitor device according to the present invention is a silicon dioxide layer formed on the bottom electrode 211 lightly doped with ions, and the thickness of the dielectric layer is thinner than that of the conventional art. For example, according to the preferred embodiment, the thickness of the dielectric layer 22a is 100 Å, while the thickness of the dielectric layer according to the prior art is 400 Å. Accordingly, the capacitance of the capacitor according to the present invention is higher than that of the prior art. Furthermore, the capacitor in the invention is formed with a BiCMOS device. Thus, additional steps aren't added in the process. The cost isn't increased, either.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A capacitor device formed with BiCMOS processes on a semiconductor substrate, comprising:

a buried layer formed in the semiconductor;

an epitaxy layer formed over the semiconductor;

a bipolar junction transistor formed in the epitaxy layer having a collector region;

a CMOS transistor having a gate oxide and a gate electrode;

a well region formed with the collector region in the epitaxy layer and contacting the buried layer, said well region being a bottom electrode of the capacitor device;

an oxide layer formed with the gate oxide on the epitaxy layer over the well, said oxide layer being a dielectric layer of the capacitor device; and a conducting layer formed with the gate electrode on the oxide layer, said conducting layer being an upper electrode of the capacitor device.

2. The device as claimed in claim 1, further comprising an insulating layer formed on the epitaxy layer and in which a plurality of plugs are formed.

3. The device as claimed in claim 1, wherein the semiconductor substrate is a silicon substrate.

4. The device as claimed in claim 1, wherein the well is doped with a dosage of $10^{15}$ to $10^{19}$ atoms/cm$^3$.

5. The device as claimed in claim 1, wherein the oxide layer over the well region is a silicon dioxide layer with a thickness of 50 to 500 Å.

6. The device as claimed in claim 1, wherein the conducting layer is a polysilicon layer with a thickness of 1000 to 5000 Å.

* * * * *